United States Patent [19]
Ohmi et al.

[11] Patent Number: 6,074,538
[45] Date of Patent: *Jun. 13, 2000

[54] THIN FILM FORMING EQUIPMENT

[75] Inventors: Tadahiro Ohmi, 1-17-301, Komegabukuro 2-chome, Aoba-ku, Sendai-shi, Miyagi-ken 980; Tadashi Shibata, Sendai; Masaru Umeda, Tokyo, all of Japan

[73] Assignee: Tadahiro Ohmi, Miyagi-Ken, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/872,467

[22] Filed: Jun. 10, 1997

Related U.S. Application Data

[62] Division of application No. 08/508,405, Jul. 31, 1995, Pat. No. 5,683,072, which is a continuation of application No. 08/097,861, Jul. 26, 1993, abandoned, which is a continuation of application No. 07/990,549, Dec. 14, 1992, abandoned, which is a continuation of application No. 07/536,547, Jul. 10, 1990, abandoned, which is a continuation of application No. PCT/JP89/00023, Nov. 1, 1989.

[30] Foreign Application Priority Data

Nov. 1, 1988 [JP] Japan ..................... 63-3522

[51] Int. Cl.[7] ............................ C23C 14/00
[52] U.S. Cl. .................. 204/298.06; 204/298.08; 204/298.23
[58] Field of Search .............. 204/298.08, 298.06, 204/298.34, 192.12, 298.23

[56] References Cited

U.S. PATENT DOCUMENTS

| | | | |
|---|---|---|---|
| 4,313,815 | 2/1982 | Graves | 251/193 |
| 4,384,918 | 5/1983 | Abe | 204/298.15 |
| 4,547,247 | 10/1985 | Warrenbach | 204/298.15 |
| 4,715,921 | 12/1987 | Maher | 204/298.35 |
| 4,747,577 | 5/1988 | Dimock | 251/193 |
| 4,756,810 | 7/1988 | Lamont, Jr. | 204/192.3 |
| 4,812,712 | 3/1989 | Ohnishi | 204/298.34 |
| 4,818,326 | 4/1989 | Lui | 204/298.35 |
| 4,824,546 | 4/1989 | Ohmi | 204/298.08 |
| 4,851,101 | 7/1989 | Hutchinson | 204/298.25 |
| 4,897,171 | 1/1990 | Ohmi | 204/298.15 |
| 4,944,860 | 7/1990 | Branhall | 204/298.15 |
| 5,082,242 | 1/1992 | Bonne | 251/331 |
| 5,161,774 | 11/1992 | Engelsdorf | 251/129.01 |

FOREIGN PATENT DOCUMENTS

| | | |
|---|---|---|
| 41470 | 3/1984 | Japan . |
| 59/179786 | 10/1984 | Japan . |
| 61/112312 | 5/1986 | Japan . |

*Primary Examiner*—Maria Nuzzolillo
*Assistant Examiner*—Laura Weiner
*Attorney, Agent, or Firm*—Baker & Daniels

[57] ABSTRACT

A gate valve for a thin film forming apparatus. The gate valve includes two adjoining low-pressure chambers and a wall separating the two chambers. The wall includes an aperture and a thin plate for covering the aperture. The thin plate is movable in a direction substantially parallel to the plate surface. The gate valve further includes a voltage supply for applying a direct current between the thin plate and the wall.

2 Claims, 6 Drawing Sheets

THIN FILM FORMING EQUIPMENT

This is a division of application Ser. No. 08/508,405, filed Jul. 31, 1995, now U.S. Pat. No. 5,683,072 which is a continuation of application Ser. No. 08/097,861, now abandoned, filed Jul. 26, 1993, which is a continuation of Ser. No. 07/990,549, filed Dec. 14, 1992, now abandoned, which is a continuation of application Ser. No. 07/536,547, filed Jul. 10, 1990, now abandoned, which is a PCT/JP89/00023 filed Nov. 1, 1989.

FIELD OF THE INVENTION

The present invention relates to thin film forming equipment suitable for the manufacture of ultra-high density integrated circuits.

BACKGROUND OF THE INVENTION

The progress of LSI technology is really amazing, and the degree of integration is increasing year by year. Taking an example in dynamic random access memory (DRAM), memory capacity has quadrupled in three years. The product development for 4-megabit DRAM has now been completed, and technical development is now directed to 16-megabit and 64-megabit DRAMs. With the increase in the degree of integration, the dimension of the unit element is minimized, and the minimum dimension is decreasing more and more from 1 $\mu$m to the order of submicron. The structure of various IC devices is basically composed of a laminated structure of various types of thin film. For example, the main portion of a MOS transistor is composed of 3-layer structure comprising electrode material, insulating thin film and semiconductor substrate. The capacitor, used for a memory cell of DRAM, has semiconductor 3-layer structure with a high dielectric thin film sandwiched by upper and lower electrode materials. A non-volatile memory element has a 5-layer structure composed of semiconductor substrate, insulating thin film, electrode material, insulating thin film, and electrode material. Thus, the thin film laminated structure is a structure dominating the most important characteristics of the device. Because the thickness of these thin films is increasingly becoming thinner with the miniaturization of the device, the characteristics of these thin films are the important factor to determine the characteristics, yield and reliability of LSI. Therefore, the keypoint for the actualization of ultra-high integration is the technique to form high quality thin film and to produce the laminated structure of thin film with high reliability. Further, this process requires low temperature instead of high temperature of 900–1000° C. as used at present. For example, to produce a capacitor structure using aluminum as a lower electrode, the temperature to form an insulating film and electrode on it must be lower than the melting point of aluminum (about 630° C.) for instance, 500–550° C. or less—or more preferably, 400° C. or less. For accurate control of N-type or P-type impurities, it is necessary to reduce the process temperature to 700° C. or less.

In the following, description will be given on the method to produce a conventional type thin film laminated structure, taking an example in the manufacturing process of a DRAM memory cell. FIG. 23 is a schematic drawing showing the sectional structure of a memory capacitor unit of a DRAM memory cell as formed by the conventional technique. To produce this structure, field oxide film 2303 is formed on silicon substrate 2302, and the surface of silicon substrate 2302 of memory capacitor forming portion 2301 is exposed. Then, $SiO_2$ film 2304 of about 100 Å is formed by thermal oxidation at 900° C. Thereafter, polycrystal silicon thin film 2305 is deposited by CVD method, and a memory capacitor is produced through the patterning into the predetermined shape. In this process, after the surface of silicon substrate 2302 is exposed by etching with dilute HF solution, the wafer is placed into a thermal oxidation furnace to grow the oxide film. After the wafer is taken out of the furnace, it is placed into a CVD apparatus and polycrystal silicon film 2305 is deposited, and this is processed to the predetermined pattern. Namely, the interface of each thin film comes into contact with atmospheric air because each thin film composing the laminated structure is formed in a separate apparatus in the normal process. For this reason, the interface is contaminated by adsorption of adsorptive contaminants in the gas in the atmospheric air, and this results in the instability and variation of isolation voltage or other characteristics of thin film oxide film. The oxide film of 100 Å is the insulating film to be used for 1-megabit DRAM. For 4-megabit or 16-megabit DRAM, it is necessary to have a thin film of 50 Å or thinner, and the problem of interface contamination is an important and serious issue for the decrease of isolation voltage or the reliability of thin film oxide film. In some cases, silicon nitride film ($Si_3N_4$) thin film having a higher dielectric constant than thermal oxide film of Si ($SiO_2$) is used as capacitor insulating film 2304 of DRAM. Because it is very difficult to form $Si_3N_4$ film through direct nitriding of silicon, $Si_3N_4$ film deposited by LPCVD method is used. Normally, thin film formed by depositing has poor characteristics in the interface with silicon and there are more defects such as pinholes. Accordingly, after the silicon surface is processed by thermal oxidation, the characteristics of interface with Si is improved by depositing $Si_3N_4$ film, and pinholes are filled up by thermal oxidation after $Si_3N_4$ film is deposited. In such a process, the final capacitor structure is a 5-layer laminated structure composed of Si, $SiO_2$, $Si_3N_4$, $SiO_2$ and poly-Si (polycrystal silicon), this means that there are four interfaces to be exposed to atmospheric air, and it is very difficult to prevent the contamination. Also, it is almost impossible to carry out the process at low temperatures because thermal oxidation is usually performed at the temperature of 850°–900° C.

To produce and utilize ultra-high integration in the future, it is very important to establish the technique to produce the laminated structure of very thin film at low temperatures and with no possibility to induce contamination on the interface.

SUMMARY OF THE INVENTION

To attain such purposes, the present invention offers a gate valve for thin film forming equipment suitable for the manufacture of ultra-high density integrated circuits.

The present invention proposes a gate valve for thin film forming equipment comprising two adjoining low-pressure chambers, a wall separating the chambers and having a freely openable and closeable aperture, a thin plate for covering the aperture and having a plate surface, a device for moving the thin plate in a direction substantially parallel to the plate surface, and a voltage supply for applying a direct current voltage between the thin plate and wall. The plate surface may be polished and disposed facing a peripheral part of the aperture.

DESCRIPTION OF THE PREFERRED EMBODIMENT

In the following, the embodiments of this invention will be described in connection with the drawings.

Figure 1:
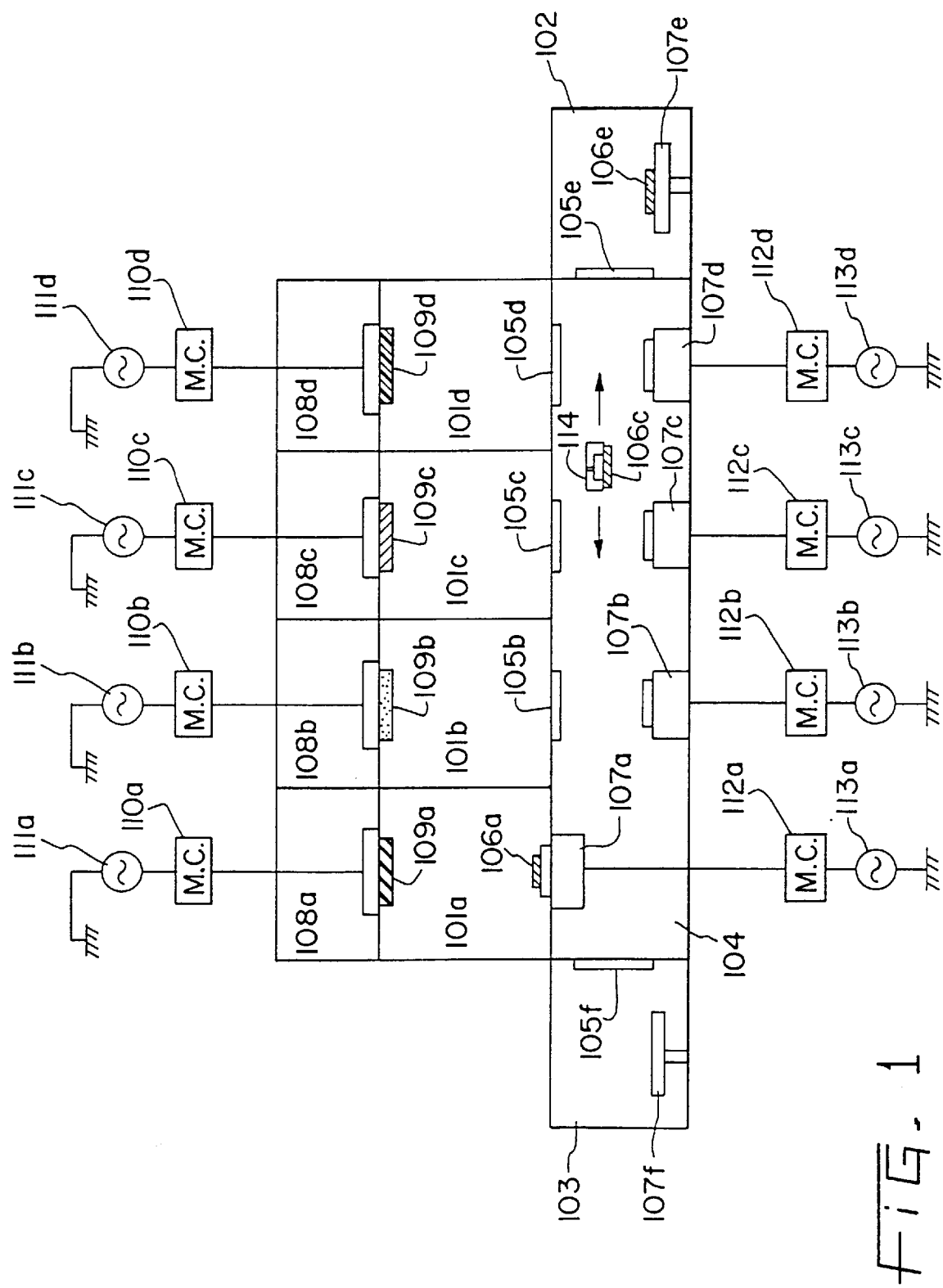
FIG. 1 is a system diagram of the equipment of an Embodiment of the present invention.
Figure 2:
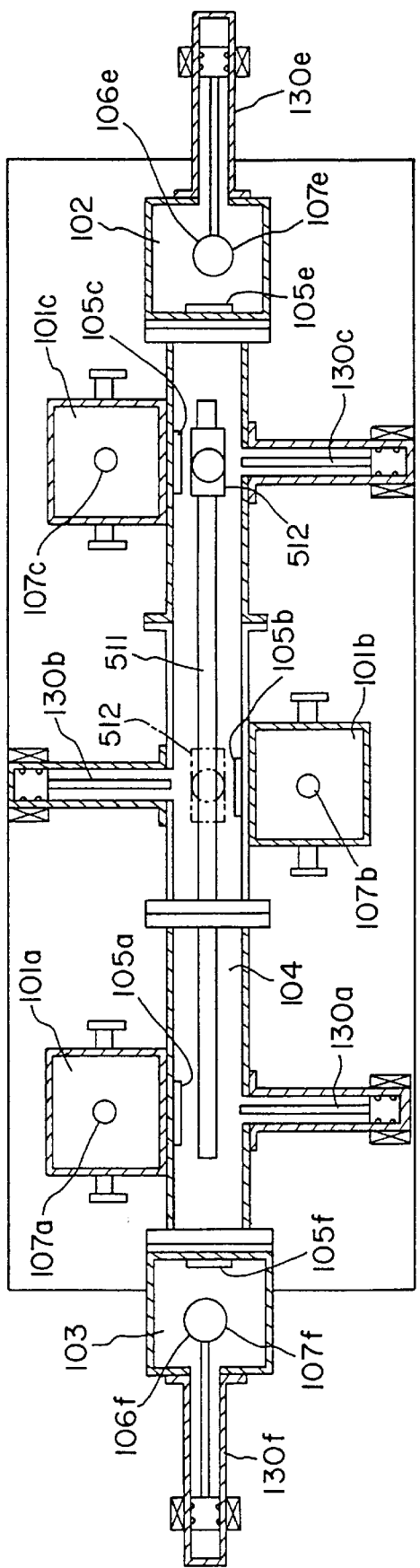
FIG. 2 is a sectional view of the equipment to show another embodiment of this invention.

FIG. 1 is a system diagram of the thin film forming equipment showing an embodiment of this invention. The equipment comprises four reduced pressure chambers (process chambers), each provided with different functions, as a sputter chamber for metal thin film 101*a*, a sputter chamber for insulating thin film 101*b*, a cleaning chamber 101*c*, and an oxidation chamber 101*d*. 102 is a wafer load chamber and is used to send the wafer to the equipment, 103 is an unload chamber and is used to take the wafer out of the equipment. 104 is called a transport chamber and is used to transport the wafer to each predetermined chamber of the above 4 process chambers. For the transport of wafer 106*c*, for example, wafer chuck 114 of electrostatic adsorption type is used. Specifically, the wafer is set on wafer holders 107*a–d* of the predetermined chamber using a magnetic floating type transport mechanism. These wafer holders 107*a–d* have such structure that, wafers are adsorbed and maintained by electrostatic chuck, and, after the gate valves 105*a–*105*d* of the corresponding chamber (gate valve 106*a* of process chamber 101*a* not shown) are opened, the entire wafer holder moves upward to place wafer into the predetermined process chamber and the gap between process chamber and transport chamber is sealed in an airtight manner. In FIG. 1, silicon wafer 106*a* and wafer holder 107*a* are set on the sputter chamber 101*a* for metal thin film.

108*a*–108*d* are called target chambers, and target materials 109*a*–109*d* can be exchanged without breaking the vacuum condition. In each target, RF power supplies 111*a*–111*d* are connected through the tuning circuits 110*a*–110*d*, and RF power supplies 113*a*–113*d* are connected to wafer holders 107*a*–107*d* through each of the tuning circuits. Although not shown in figure, a vacuum exhaust unit is connected to each of these chambers.

In the structure shown in FIG. 1, target and wafer are placed face-to-face in upward and downward directions with wafer down and target up, but the arrangement is not limited to this structure. For example, heavy target may be placed at a lower position, and the wafer may be at upper position. In so doing, it is possible to prevent the dropping of the target in case adsorption power is temporarily weakened due to transient fluctuation of supply voltage to the electrostatic chuck when the target is maintained by electrostatic chuck. However, when small pieces of wafer or dust are attached on the wafer, it falls on the target, and target may be contaminated, or the quality of thin film formed by sputtering may be extremely deteriorated. Therefore, it is more effective to have the structure where target 109*a* and wafer 106*a* are placed face-to-face in a left-right direction as shown in FIG. 1. This eliminates the problem of dust attachment on the wafer and target.

Such is an outline of the arrangement of this equipment and the formation of multilayer thin film structure. In the following, description will be given on the details of each component of the equipment, and the details of the formation of multilayer thin film structure to explain the operation and the effect of the present invention.

Figure 3:
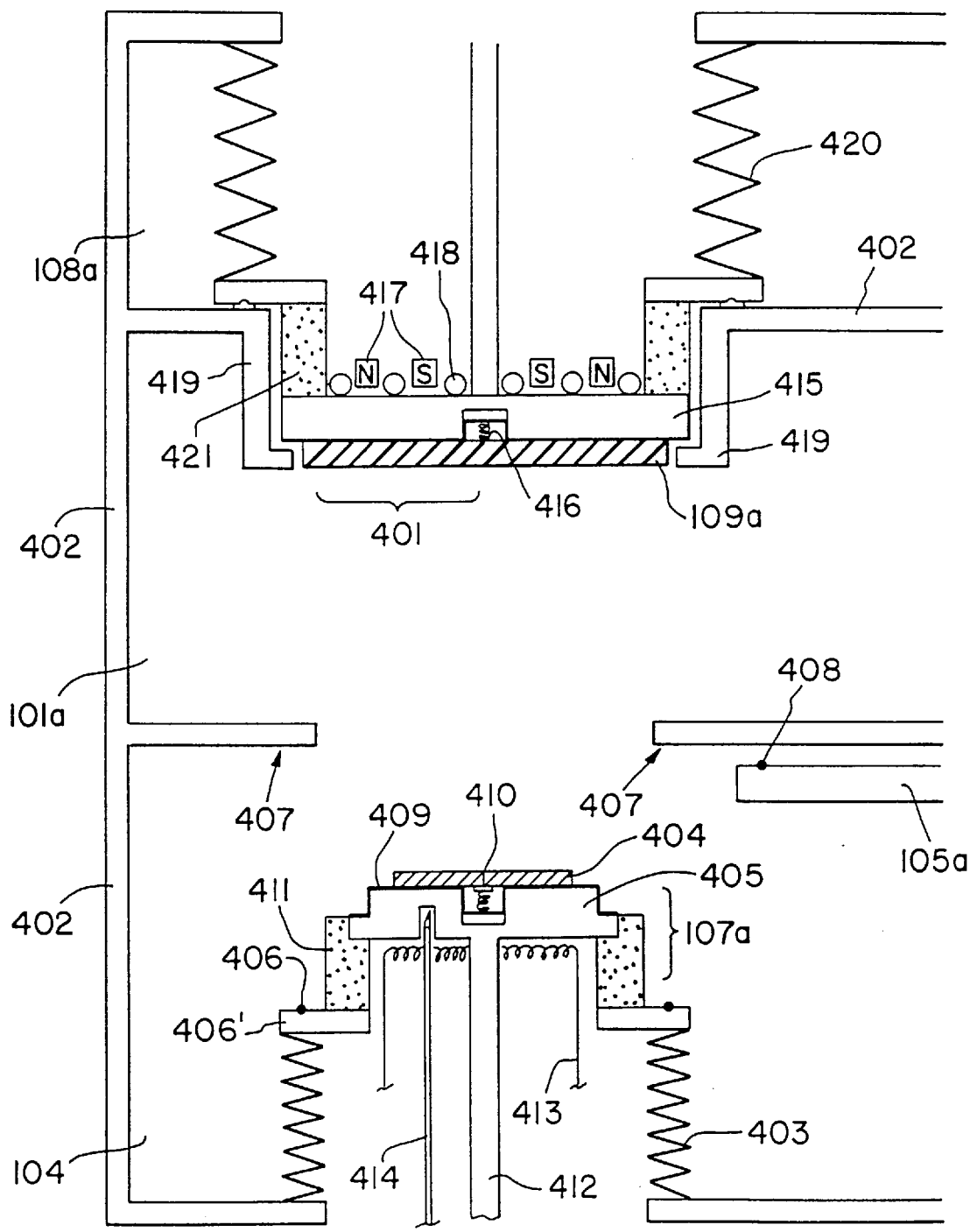
Figure 4:
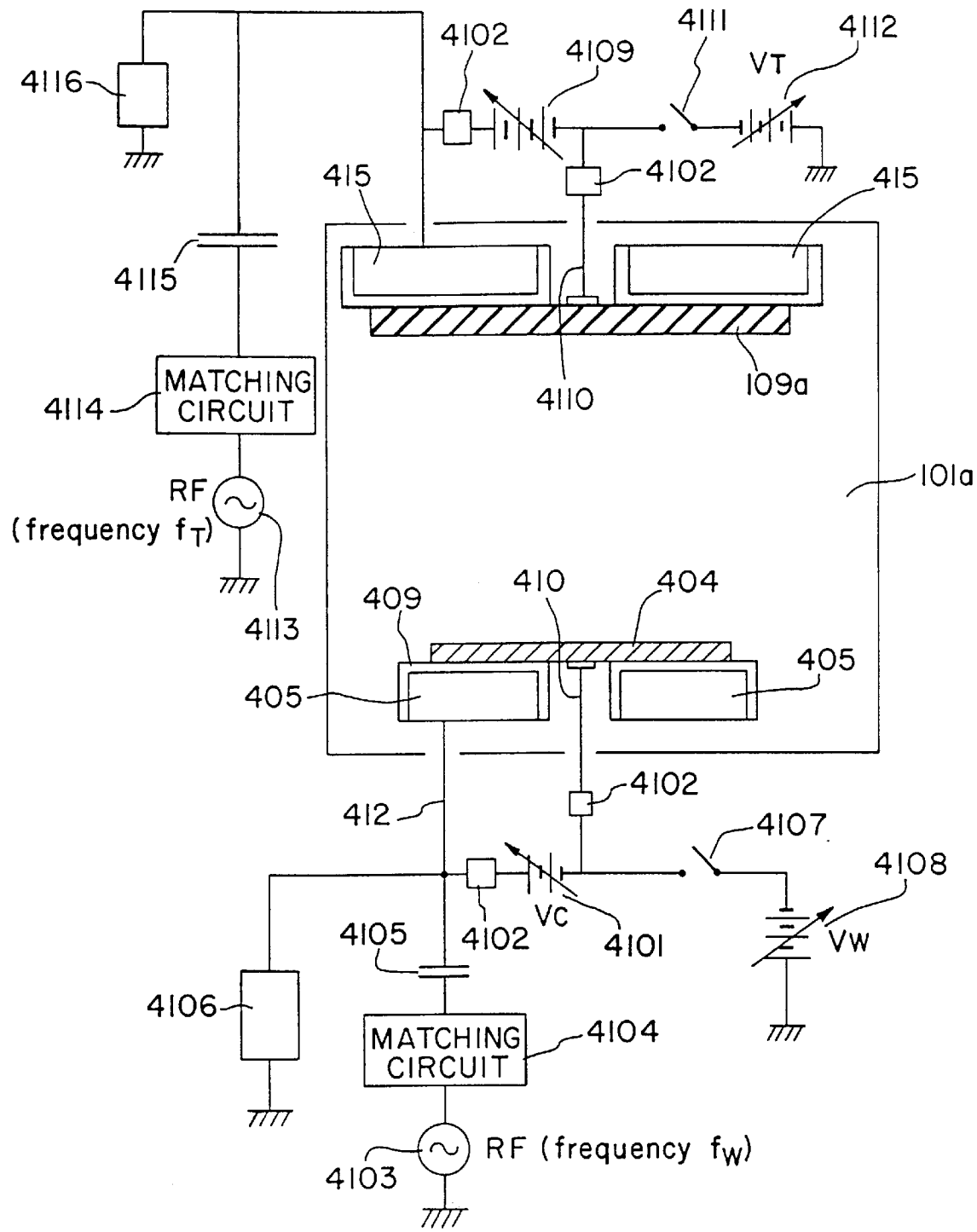

FIGS. 3 and 4 are the detailed representations of the structure of sputter chamber for metal thin film 101*a*, which is one of the process chambers. In the figures, transport chamber 104, target chamber 108*a*, wafer holder 107*a*, gate valve 105*a*, target 109*a*, target holder 401, etc. are also shown.

To obtain high quality thin film by sputtering, it is important to completely exclude the intermingling of impurities such as moisture into the film forming process. For this purpose, the Ar gas method must be adopted as described above. In addition, it is important to reduce the degasification from chamber material or from the gas pipe material surface. The wall material 402 of the chamber of the equipment of FIG. 3 is made of SUS304L or SUS316L. It is important to process the surface with the treatment to reduce the adsorption of $H_2O$ molecules and to facilitate the desorption. As to such treatment, there is the following method:

First, mirror polishing is performed not accompanied with processed layer of the stainless steel surface. To the inner surface of the pipes, for example, electropolishing is applied to the inner surface of the chamber.

Next, purging is performed with Ar or He with a moisture content of 1 ppb or lower. Further, temperature is increased to about 400° C. and purging is performed. After $H_2O$ molecules adsorbed on the surface are removed almost completely, pure oxygen with a moisture content of about 1 ppb or less is supplied, and temperature is increased to 400°–500° C. and the inner surface is oxidized. Oxide fihn obtained through thermal oxidation of the stainless steel surface has a higher corrosion resistant property to corrosive gases such as HCl, $Cl_2$, $BCl_3$, $BF_3$, etc. compared with passive film formed by the conventional method using nitric acid, etc. Further, it has many excellent features such as low surface occlusion of water molecules harmful to the process, high desorption property, etc.

Next, description will be given on oxide film obtained through oxidation of a stainless steel surface. Table 2 summarizes film thickness and refractive index of an oxide film formed on the surface when SUS316L and SUS304L are oxidized by ultra-high purity oxygen. It is expressed as the relation between oxidation temperature and time. It should be noted that oxide film thickness does not depend on time, and it is determined only by temperature. This suggests that the oxidation of SUS is proceeding by the processes as described by the models of Cabrera and Mott. In other words, when temperature is controlled to a constant level, oxide film grows to the desired thickness. Thus, it is possible to produce the oxide film having uniform thickness and high density without pinholes.

TABLE 1

Moisture content desorbed from sample pipe (Temperature-dependent property)

| Temp.(° C.) Sample | Room temp. –120 | 120–200 | 200–300 |
|---|---|---|---|
| Electroploished pipe | 420 | 600 | 860 |
| Pipe passivated by nitric acid | 750 | 630 | 990 |
| Pipe by this invention | 25 | 70 | 100 |

Unit: ppb

TABLE 2

Film thickness of passivation film

| | | SUS316L | | SUS304L | |
|---|---|---|---|---|---|
| Oxidatian temp. (° C.) | Oxidation time (hr) | Film thickness (Å) | Refractive index | Film thickness (Å) | Refractive index |
| 400 | 1 | 114.0 | 2.71 | 78.8 | 3.26 |
| | 4 | 110.9 | 2.87 | 74.2 | 3.41 |

TABLE 2-continued

| | | Film thickness of passivation film | | | |
|---|---|---|---|---|---|
| | | SUS316L | | SUS304L | |
| Oxidation temp. (° C.) | Oxidation time (hr) | Film thickness (Å) | Refractive index | Film thickness (Å) | Refractive index |
| 500 | 1 | 125.7 | 2.93 | 95.8 | 3.60 |
| | 2 | 126.1 | 2.91 | 95.2 | 3.50 |
| | 4 | 126.8 | 2.96 | 91.3 | 3.81 |
| 550 | 1 | 130.9 | 3.02 | 102.9 | 3.56 |
| | 4 | 141.8 | 3.13 | 110.9 | 3.76 |

This means that Fe oxides are present near the surface, while there are more Cr oxides near the interface between the oxide film and SUS substrate, showing a 2-layer structure. This is also supported by the results of energy analysis of ESCA spectrum, i.e. chemical shift due to the formation of oxides is observed in Fe near the surface, while this disappears in deeper portions where chemical shift due to the formation of Cr oxides is seen. There has been no report so far describing that a 2-layer film was formed by the oxidation of SUS, and very little is known about the mechanism of the excellent corrosion resistent property of the reduced pressure equipment of this invention and the desorption property of adsorbed gas, whereas it is attributable to the formation of a dense 2-layer film. Here, the film with thickness of about 100 Å was used, while the same effect is obtained with the film with thickness of 50 Å or more. However, it is preferable that the film thickness is 50 Å or more because pinholes are generated when film thickness is less than 50 Å and the corrosion resistant property is decreased.

To form a dense oxide film, it is important to remove the layer degenerated during processing of SUS surface and to flatten the surface. In the present embodiment, the material with surface phase of Rmax at 0.1 to 0.7 $\mu$m was used, whereas it is known that good passivation film can be obtained when the maximum difference between peak and bottom of the irregularities are within a circle with radius of 5 $\mu$m is up to 1 $\mu$m.

By the passivation process as described above, it was possible to make the chamber match the ultra-high vacuum condition and also to provide full corrosion resistant property against corrosive gas. This has made it possible to remove the deposited reaction products attached on wall surface by passing chlorine type gas for the cleaning inside the chamber and by increasing chamber temperature. Because the inner surface of the chamber is flat and is provided with a dense passivation film, the adhesive power of the attached objects is very weak, and this facilitates gas etching. If such cleaning is not required, it is also effective to adopt an aluminum alloy chamber, which is lightweight and suitable for ultra-high vacuum condition.

For the target material, impurities are completely removed and gas components such as oxygen are removed by vacuum dissolving.

Next, description will be given of wafer holder 107a in connection with FIG. 3. The entire holder is connected to the outer wall of the chamber by bellows 403 and is movable upward and downward. With silicon wafer 404 adsorbed on the electrostatic chuck electrode 405, it is moved up and down, and the wafer is placed into or taken out of the process chamber 101a. For example, when the wafer is to be inserted into the process chamber, the entire wafer holder 107a is moved up. By closely fitting O-ring 406 on the flange surface 407 of the chamber, airtight sealing is provided between the process chamber 101a and the transport chamber 104. Here, the O-ring is adopted as a sealing material, while it is more effective to use a metal sealing with less degasification. In this case, it is preferable to use a metal seal, which has enough elasticity to endure the repeated removing and inserting operation and has a high sealing property. For example, it is effective to use an O-ring made of elastic resin, which is placed in a metal ring in the shape of a plate spring. Such a ring should be made of Al, Ni, SUS316L, Ni-coated stainless steel, etc., which shrinks within the range of elasticity (i.e. not to cause plastic deformation). In this case, a sealing surface is maintained by the contact of the metal surface. (If this surface is made as a mirror surface with Rmax of 0.2 $\mu$m or less, it is possible to reduce the leakage.) Because the pressing force to maintain the seal is supplied by a rubber O-ring, it is possible to provide high airtightness and repeated operation.

It is preferable to furnish the opening of the ring on the side with the lower degree of vacuum. Further, it is preferable to provide a notch to communicate with the interior and the opening because this prevents the stagnation of gas toward the interior. This notch is crushed when pressure is applied on the ring, and the interior is sealed. The plate may be furnished with a hole communicating with the interior.

When wafer holder 107a is waiting in the transport chamber, the opening is sealed by gate valve 105a, and airtight sealing is provided between the process chamber and transport chamber.

An O-ring 408 may be used for this sealing, whereas it is more effective to use a metal seal. Other sealing means may be used if complete airtightness is assured.

In any case, it is important when vacuum sealing is provided by elastic material to adopt such a structure that relative position of flange surface 407 and flange surface 406 in FIG. 3 is determined regardless of the sealing component 406.

Figure 6:
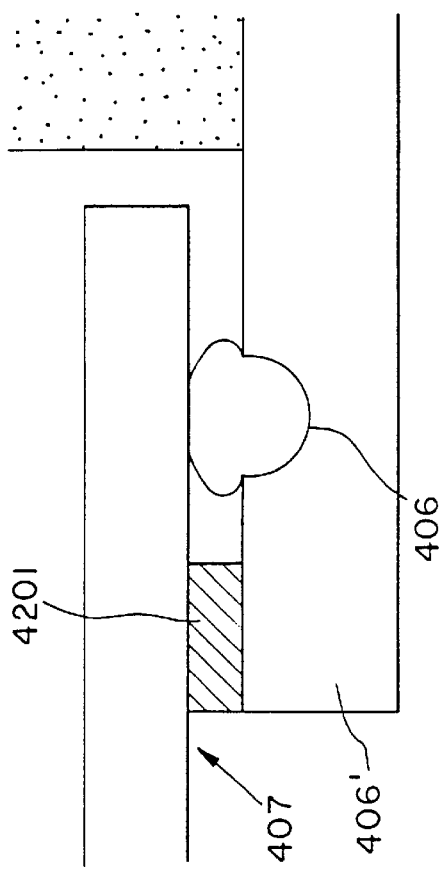
FIGS. 3 to 8 are schematic drawings of the sputter chamber.

Specifically, it is preferable that the position is determined not by the force to crush 406 but that relative position is always kept constant by inserting a stopper 4201 not easily deformed as given in the enlarged view of FIG. 6. In so doing, the O-ring is always compressed by a constant force, and a stable sealing property is obtained. Of course, this also applies to the case where a metal ring is used instead of an O-ring. The stopper 4201 as described above may be formed directly when flange surface (407 or 406') is fabricated, or a ring-like part may be mounted later. It is preferable to place this stopper at the side with lower degree of vacuum to prevent the formation of a dead zone on the side with a higher degree of vacuum.

It is also important to furnish a guide for upward and downward movement of 406', which moves up or down to prevent lateral deviation when the sealing component is compressed.

405 represents an electrostatic chuck electrode to maintain the wafer, and it is made of a metal such as stainless steel, Mo, Ti, etc. An insulating film 409 is formed on its surface. As this insulating film, $Al_2O_3$ and AlN are formed on the surface of the electrode by plasma spraying, and the surface is flattened by polishing. The thickness is about 10–100 $\mu$m. By giving a potential difference of several hundred volts between wafer 404 and electrode 405, the wafer can be held on the wafer holder by the force of 1 kg/cm$^2$ or more. Normally, when the wafer is placed on the stage under vacuum condition, it comes into contact with the stage only at 3 points, and it has been impossible to set accurate wafer temperature. According to the equipment of this invention, the temperature of the wafer can be controlled with high accuracy because the wafer is held on the stage with strong force. Potential is applied to the wafer by metal electrode 410. Electrode 410 is naturally insulated from electrode 405 and is connected to the power supply outside the system.

In the figure, a structure is adopted such that the potential of the wafer is applied at the center of the wafer by the electrode 410, while a different structure may be adopted, where the potential is applied at the peripheral portion of the wafer. Taking the potential at a peripheral portion is more advantageous for temperature control of the wafer because the uniformity in the plane can be attained more easily than the case where a hole is furnished at the center of wafer holder. The entire electrode 405 is insulated from the chamber by insulator 411. Further, high frequency power with frequency fw is supplied to the electrode 405 from outside by 412.

FIG. 4 shows an example of connecting relation of electrode 405 and wafer 404 with external power supply. In FIG. 4, the same number refers to the same component as in FIG. 3. 4101 is a DC power supply for the electrostatic chuck, and it gives a DC potential difference Vc between the electrostatic chuck electrode 405 and the wafer 404 through high frequency filter 4102, which cuts off high frequency and supplies only the DC potential. 4103 is an RF power supply having $f_W$ of 100 MHz, and high frequency power is supplied to the wafer by the installation electrode 412 through matching circuit 4101 and blocking capacitor 4105. By changing the power from this high frequency power supply 4103 within the range of several watts to several tens of watts, the DC potential of wafer 404 can be set to the desired value. Or, by changing the matching condition of the matching circuit 4104, the DC potential of wafer can be changed.

Even when the wafer surface is covered with insulating film such as $SiO_2$, the DC potential of the surface is almost the same as the potential of the wafer. Because the capacitor capacity generated by $SiO_2$ film is much higher than blocking capacitor 4105, self-bias due to high frequency appears on both ends of this capacitor in almost all cases.

Therefore, by monitoring the potential of the wafer by a voltmeter through a high frequency filter, by feeding this back to RF power controller or to matching circuit controller, it is possible to accurately control DC potential on wafer surface to a constant value. By the wafer potential thus determined, it is possible to accurately control the energy of ions coming to the wafer surface from the plasma to the desired value. On the other hand, high frequency with different frequency $f_T$ (e.g. 13.56 MHz) is given to the target, and the energy is transferred to the wafer by the frequency $f_T$ through capacitive coupling of target electrode 415 and wafer holder electrode 405.

The circuit of 4106 is a circuit, which maintains high impedance to the frequency $f_W$ and short-circuits high frequency of frequency $f_T$. By this circuit, DC potential of the wafer becomes controllable only by high frequency of $f_W$ applied on the wafer holder. If L and C parallel resonance circuit is used with the relation:

$$2\pi f_W = 1/(LC)^{1/2}$$

it is open only to the high frequency of $f_W$. To the other frequency, it is short-circuited if C is taken at high value, and the desired function can be fulfilled. Because DC potential of a certain degree must be generated on wafer holder 405, a capacitor with sufficiently high capacity is connected in series with the above LC parallel circuit.

In case electroconductive thin film is formed on the wafer surface and such a thin film is electrically connected with wafer, the potential of the wafer may be directly controlled by the DC power supply. In such a case, the wafer potential, i.e. the potential of wafer surface, can be controlled by DC power supply 4108 when the switch 4107 is turned on.

In FIG. 3, 413 is a heater, and it is used to heat the electrode 405 of the wafer holder to the desired temperature. In this case, it is possible to uniformly heat the wafer to the same temperature as the electrode because wafer 404 is adsorbed strongly by the electrostatic chuck and to control wafer temperature accurately. 414 is a fiber thermometer, which measures temperature by sensing the luminance of black body radiation through the optical fiber. Thus, accurate temperature measurement is assured without being disturbed by RF noise and the like. Through the feedback of the results of measurement to the heater controller, accurate temperature control can be performed.

Here, description is given only to the heating system using a heater, while precise temperature distribution control can be performed through discharge heating by a number of plasma torches and through control of the discharged current.

One of the major features of the equipment by this invention is that no contamination source such as wafer transport mechanism, wafer heating mechanism, etc. is contained in the process chamber. This makes it possible to maintain the process chamber in a very clean condition and to form high quality thin film. Further, because the heating mechanism is completely separated from the vacuum system and is placed in atmospheric air or under normal pressure, there is no need to worry about contamination and uniform heating is assured.

Next, description will be given of the target holder 401 in connection with FIG. 3. 415 is a holder electrode and is made of metal such as stainless steel, Ti, or Mo. Its surface is covered with insulating thin film such as $Al_2O_3$, AlNi, $SiO_2$, etc. and it works as an electrostatic chuck. To the metal target 109a, potential is given from backside by the electrode 416, and it is electrostatically adsorbed and held by potential difference between the electrode 416 and the holder electrode 415. 420 is an insulating material to electrically insulate the holder electrode 415 from the chamber. The other mechanism of the target holder is almost the same as that of the wafer holder 107a, and a detailed description is not given here. 417 is a magnet for magnetron discharge, and 418 is a pipe to pass cooling medium to cool the target. 419 is a ground shield to prevent the sputtering of target holder. This ground shield may not be provided if the diameter of the target is larger than the diameter of the target holder. This ground shield was not described in the explanation of the wafer holder 107a, but this may be provided similarly to the wafer holder. The target holder 401 has bellow seal 420 as in the case of wafer holder 107a, and this facilitates upward and downward movement. When the target is replaced, the entire wafer holder moves up by shrinking bellows, and a gate valve (not shown) closes the opening as in the case of wafer holder.

The holder electrode 415 moves up again after adsorbing the target, and target stocker is rotated to have the notch 1104 under the holder electrode. The holder 415 extends downward lower than the notch, inserts the target into the process chamber 101a and is arranged as shown in FIG. 3.

It goes without saying that the load lock exchange mechanism of this target is used for other purposes than the sputter chamber for metal thin film of FIG. 3. In case the target is an insulating material, electroconductive material such as metal may be provided on backside. A metal plate may be attached, or metal thin film may be formed by sputtering.

The target stocker may not be in the shape of a disk. Targets may be arranged linearly and may be slided to a lateral direction or to front or back directions. They may be furnished separately for each of the process chambers (101a–101d) of FIG. 1, or a common stocker may be provided, regarding all target chambers 108a–108d as one common chamber. The target in the target stocker may be maintained by gravity or it may be mechanically supported by electrostatic chuck or by mechanical means.

Conventionally, the target has been forcibly cooled down from backside of the target holder using a cooling pipe (FIG. 3; 418) because temperature is rapidly increased during sputtering. In order to have satisfactory thermal transfer from target to holder, it was necessary to fix it on the holder, using screws or other means. Therefore, the target is normally replaced by breaking the vacuum condition in the process chamber 101a, and it is usually replaced only when the target material is worn out. Accordingly, none of the conventional sputtering film forming equipment was provided with a mechanism to replace the target without breaking the vacuum condition. In contrast, it is possible by the equipment of this invention to easily replace the target because of the adoption of the target holder with electrostatic chuck. Thus, film can be formed from various types of materials in a single chamber, and this extensively expanded the functions of the equipment. More important is the fact that there is no need to fix the target by screws.

Because the target was fixed by screws usually from the surface of the target, screw material used to be a cause for contamination as it was sputtered. For this reason, screws were manufactured of the same material as target material, while this resulted in the difficulties in fabrication. Particularly, when target material is purified up to the purity of 6N–7N or more, each crystal size is increased to as high as several mm. During fabrication, it is split along crystal grain boundary, and it was impossible to perform complicated fabrication. For this reason, the material with a purity as low as about 3N has to be used for the parts such as screws which requires fine fabrication. In contrast, in case of the equipment by this invention, there is no need to use screws because electrostatic adsorption holder is used. The shape of target is also in simple disk type, and it is very easy to fabricate. Thus, it is possible to use the material of high purity, and the so-called cutting margin may be smaller in the fabrication of the target. This means effective utilization of expensive target material of high purity, and this contributes greatly to the economy of fabrication.

In the past, thick material had to be used as target. However, when a thick target is used, the target absorbs magnetic force in case a magnet is furnished behind it, and magnetic field of film making space is weakened. In contrast, a thinner target can be used in the equipment of this invention, and this makes it possible to produce thin film with good film quality at high speed.

In FIG. 3, the potential difference between electrostatic chuck electrode 415 and the target 109a is given by DC power supply 4109 as connected through high frequency filter 4102. The potential of the target is directly supplied by 4110, and contact is kept at the center as shown in the figure, while this may be taken from the peripheral portion of the target. For the power supply 4109, it is preferable to use battery backup in order to prevent the dropping of the target in case of power suspension. For DC potential of the target, self-bias generated by Rf power supply 4113 may be used. In case the target is made of metal material, it is also effective to close the switch 4111, to connect DC power supply 4112 and to control the potential. 4116 is a circuit having the function similar to that of 4106, and it is opened only to the frequency $f_T$ of RF power supply 4113 and is grounded to the other frequency. However, it is to DC. The power of high frequency power supply (frequency $f_W$) to control the wafer potential is usually low, and 4116 may not be necessarily furnished. Normally, it is preferable to use the frequency lower than that of RF power supply 4103 connected to wafer, e.g. 13.56 MHz. This is to obtain higher sputtering speed by generating higher self-bias on the target compared with the wafer. This is not the case when target potential is controlled by DC power supply 4112.

In the embodiments of the invention, therefore, RF power supply with lower frequency ($f_T$) is used on target side to increase the sputtering speed, and RF with higher frequency ($f_W$) is used on the wafer side to decrease the bias of wafer. Thus, the damage to wafer substrate is reduced and the quality of thin film can be controlled. The control of the quality of actual thin film will be described later. Here, it is set that $f_T$=13.56 MHz and $f_W$=100 MHz, while this is only an example, and the combination of the other frequencies may be used.

Also, the embodiment as shown in FIG. 6 may be used as the target holder of the electrostatic chuck type. RF power is inputted to the target holder electrode 415 by capacitive coupling through thin insulating film 409, while DC power supply 4109 is inputted alone to the target holder electrode 415 through high frequency filter 4102. This makes it possible to prevent the application of high DC voltage on the capacitor, which is used in the circuit such as 4116, and reliability is increased. The same arrangement may be taken for the wafer.

Figure 8:
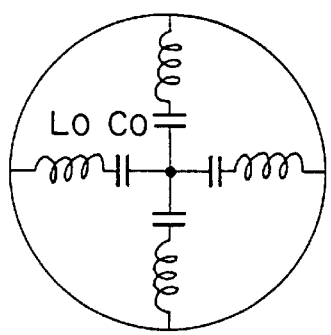

In the above, description has been given on the control of potential or target (or wafer) by a DC power supply. Description will be given below in connection with FIG. 7 on the case where control is performed without relying on DC power supply. When LC circuit is furnished to meet the conditions:

$$2pf_W=1/(L_1C_1)^{1/2}$$

$$2pf_T=1/(L_2C_2)^{1/2},$$

the impedance to $f_W$ when seen from the wafer side is 0, and the circuit is short-circuited to $f_W$. On the other hand, the impedance to $f_T$ as seen from the target side is turned to 0, and the circuit is short-circuited to $f_T$. Therefore, if $f_T$ is taken to 13.56 MHz for example, the application of 13.56 MHz on the wafer can be prevented, and the ion energy to hit wafer can be accurately controlled. It is preferable to provide LC circuits symmetrically as shown in FIG. 8.

In the above, the electrostatic chuck method was used as the method to support target, while the other methods (e.g. the method of adsorb by magnetic force) may be adopted.

The detailed description of the sputter chamber for metal thin film (FIG. 3) has been described in the above. Although not described above, a mechanism such as shutter of target may be provided in the sputter chamber, but it is not necessary for the equipment of the present invention. Namely, the equipment itself is suitable for ultra-high vacuum condition, and there is no need to perform frequent cleaning for the target surface because ultra-high purity gas is used. If necessary, it may be performed with the gate valve 105a closed. Because the contaminated layer of the surface is a layer adsorbed with small quantity of moisture, the power of RF power supply 4113 may be decreased, and the surface sputtering may be performed with a bias value lower than the sputtering threshold value of the target material 109a. In so doing, the target material will not be necessarily deposited on the inner surface of the chamber.

Next, description will be given in detail on the arrangement of the cleaning chamber 101c. Because basic structure is the same as the chamber 101a for forming metal thin film, description will be given in connection with FIGS. 3 and 4.

In this case, the target material 109a having a relatively large threshold to generate the sputtering such as $Al_2O_3$, $SiO_2$, $Si_3N_4$, AlN, etc. is used. The frequency of RF power supply 4113 to be applied on the target may be the value higher than 13.56 MHz used for metal thin film, e.g. 100 MHz. However, it is recommended to set self-bias value to 10–20 V, and a higher frequency, e.g. 200 MHz or more, may be used to generate high density plasma. For precise control of wafer potential, it is important to use high frequency entering to the target side and not to deviate wafer susceptor potential. Therefore, it is important to select ft and $f_W$ so that they are not in relation of an integer multiple. If $f_T$=100 MHz, for instance, it is desirable that $f_W$=210 MHz. In so doing, high density argon ions can be generated without sputtering the target material 109a. Argon ions thus obtained are irradiated on the surface of wafer 404 placed on the wafer holder 405. The irradiation energy of the argon ions is determined by self-bias generated on wafer by RF power supply of 4103. The objects of cleaning are primarily a very thin natural oxide film layer or adsorbed molecule layer—particularly, adsorbed molecule layer of moisture, and argon particles with kinetic energy of several to 30 eV may be irradiated.

Therefore, it is necessary to adjust RF power supply 4103 or the matching circuit 4104 in such manner that self-bias value generated on wafer is 30 V. To generate such relatively small self-bias value with high controllability, it is desirable to use high frequency, e.g. 100 MHz, for RF power supply 4103. Of course, 200 MHz or more may be used, but it is important to use a value different from target frequency ft in order to prevent the interference between target and wafer. This is also to have DC potential of target and wafer, which can be controlled independently to the optimal values.

For the target 109a, description has been given in the above example only for the case where insulating material is used. However, it may be the material having conductivity such as Si if self-bias value can be set to the value low enough not to generate sputtering. Also, because there is no need for frequent exchange with the target material 109a, load lock exchange mechanism for the target may not be furnished.

Figure 5:
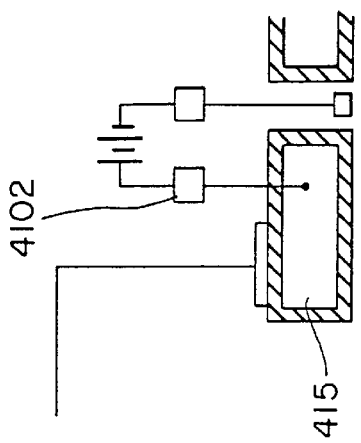

Argon is used, but $H_2O$, He, etc. may also be used. Particularly, when the argon gas added with $H_2$ gas is used for cleaning, it is possible to remove the moisture adsorbed molecule layer by the irradiation of argon gas and to effectively remove the carbon atoms adsorbed on Si surface by H ions. If the molecules of impurities such as $H_2O$, $O_2$, etc. are intermingled in gas even if in small quantities, the ultra-high impurity gas supply system (FIG. 5; 504) must be used because the surface may be contaminated. However, if special care is not taken on the gas system used and the molecules of impurities such as $H_2O$, $O_2$, etc. are contained in small quantity, it is effective to add $H_2$ by 1–30% to argon gas. This is because the oxygen radicals generated in a plasma atmosphere are bonded with hydrogen atoms before reacting with the specimen surface.

The adding of hydrogen gas is not limited to the case of the cleaning chamber 101c, and it goes without saying that the same effects can be obtained in the chambers for forming thin film such as 101a, 101b, etc.

The cleaning chamber as described above is provided with the function to irradiate ions with kinetic energy of several to 30 eV on the specimen surface, and it is very important to obtain the better interface for the formation of multilayer thin film structure. Moreover, the substrate on the basis is not damaged because low energy ions are used. Above all, there is no need to increase the temperature of substrate for this cleaning, and it can be performed at normal temperature. Therefore the heater 413 need not be furnished.

Figure 7:
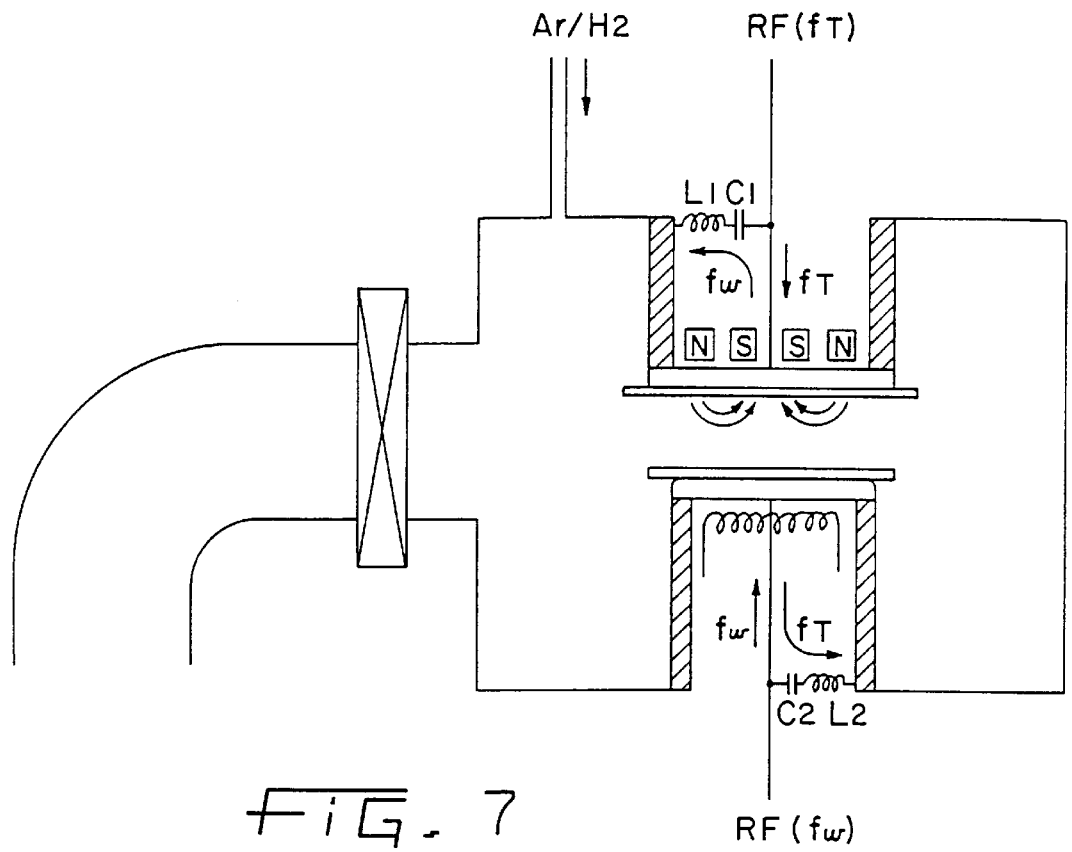

In the above, description has been given of the case where RF 4103 is applied on the wafer susceptor. For more accurate control of the energy of argon ions, however, it is preferable to use the circuit as shown in FIG. 7. That is, the values of L and C are selected to have the relation of $2\pi f_T=1/(LC)^{1/2}$ ($f_T$ is the frequency of RF to be applied on the target.) Then, the LC circuit is turned to the state of parallel resonance status, and when the earth 4203 is seen from wafer holder 4201, impedance is and the potential of the wafer approaches infinitely to the potential of plasma. Namely, the energy of argon ions irradiated on wafer approaches 0. Accordingly, if the values of L and C are a little deviated from the value satisfying the above conditions, the energy of argon ions can be accurately controlled even in the range of 0–5 eV.

The effect of the adoption of this cleaning chamber will be described later in connection with experimental data.

Next, the oxidation chamber 101d will be described in detail. Because the oxidation chamber has the same basic arrangement as the chamber for metal thin film 101a, description will be given here in connection the FIGS. 3–5. Ultra-high purity argon and oxygen gas can be introduced into this chamber from the gas supply system 504. In case Al is oxidized for example, the wafer is heated by the heater 413, and the temperature of the wafer can be set to any value within the range of 100°–450° C.

By heating the silicon wafer 404 having Al film on its surface at 400° C. for about one hour in a high purity oxygen gas atmosphere, $Al_2O_3$ thin film of about 30 Å can be formed through direct thermal oxidation of aluminum. Film thickness is not increased and remains at constant value even when oxidation time is extended. Direct oxidation of aluminum may be performed by introducing oxygen gas into chamber and by increasing wafer temperature under atmospheric condition. Or, temperature may be increased at first under vacuum condition and oxygen gas may be introduced thereafter. Oxygen pressure may be introduced at a reduced pressure atmosphere lower than atmospheric pressure, or at a higher pressure. To perform reduced pressure oxidation, exhaust is performed by a vacuum exhaust system while passing oxygen gas, and oxygen pressure may be adjusted, or it may be diluted with argon gas. Further, it is preferable to perform annealing for about 30 minutes at 400° C. in an argon atmosphere or in a vacuum atmosphere before oxidizing by oxygen. This is because argon gas of several ppm is contained in Al thin film produced by sputtering and this is released from the film and also because oxide film of better quality can be obtained by thermal oxidation of Al after degasification. It is not always necessary to furnish the target (FIG. 3; 109a), provided in the oxidation chamber, target holder 4041 and high frequency power supply 4113 as well as high frequency power supplies (4103, 4104) connected with wafer holder. However, these are required in the following cases: For example, in case film thickness of Al$_2$O$_3$ layer must be higher, e.g. 50 Å or more, Al$_2$O$_3$ target is used as 109*a*, high frequency power supply of 13.56 MHz is used as 4113, and a power supply of 100–200 MHz is used as 4103. When Al$_2$O$_3$ is formed by sputtering on Al$_2$O$_3$ formed by thermal oxidation, thick film can be obtained. By applying bias by using high frequency power supply 4103 of 100–200 MHz on wafer holder (FIG. 3; 107*a*), dense Al$_2$O$_3$ film with high characteristics can be formed. In this case, the interface between Al$_2$O$_3$ and Al thin film is formed by thermal oxidation, and the interface has more stable characteristics than the interface when Al$_2$O$_3$ film is formed by sputtering of the conventional method.

Next, description will be given of the sputter chamber for insulating thin film 101*b*. This chamber also has the same basic arrangement as the sputter chamber for metal thin film, and description will be given here in connection with FIGS. 3–5. Major difference between this chamber 101*b* and the sputter chamber for metal thin film 101*a* is that the target material 109*b* is an insulating material. Therefore, in case electrostatic chuck holder is used on the backside of the target, it is necessary to furnish electroconductive material such as Al, Mo, or W. Because bias cannot be controlled by DC power supplies (4108, 4112), these DC power supplies are not needed. However, it is convenient for forming metal film by sputtering if the target exchange mechanism is furnished to exchange insulating material and metal target. In this case, it is possible to perform bias control using DC power supplies (4108, 4112). In any case, it is desirable to open or close the switches (4107, 4111) according to each purpose.

Finally, it should be pointed out that, in the leaf processing equipment of this type, it is necessary to process at high speed, i.e. the time for one processing on one wafer must be within one minute. Specifically, in case metal thin film such as Al is formed on a wafer, it is necessary to finish the complete process within one minute, including the time to insert it into and to take it out from the process chamber 101*a*. If it is supposed that the time required for film forming is 30 seconds, the time for opening and closing of gate valve 105*a*, moving in and out of wafer, and the setting of process condition is 30 seconds at the most. To cope with such requirements, a gate valve capable to open or close within 0.5 second is required. FIG. 1 does not give the detailed structure of load chamber 102 and unload chamber 103, while these chambers are naturally provided with a wafer cassette to store several tens of wafers and also with a mechanism to receive and deliver wafers from and to the electrostatic chuck transport mechanism. For such receiving and delivering operations, high speed gate valve capable to open or close within 0.5 second must be used as the gate valves 105*e*, 105*f*, etc.

Figure 10:
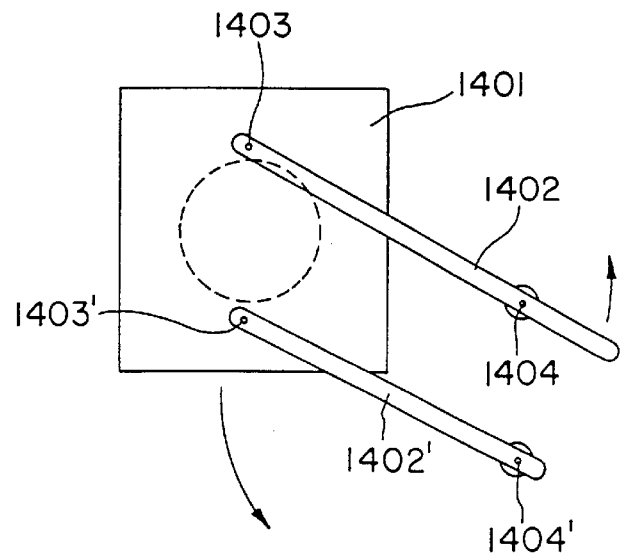
FIGS. 9 to 12 represent schematic drawings to show an example of high-speed gate valve.
Figure 9:
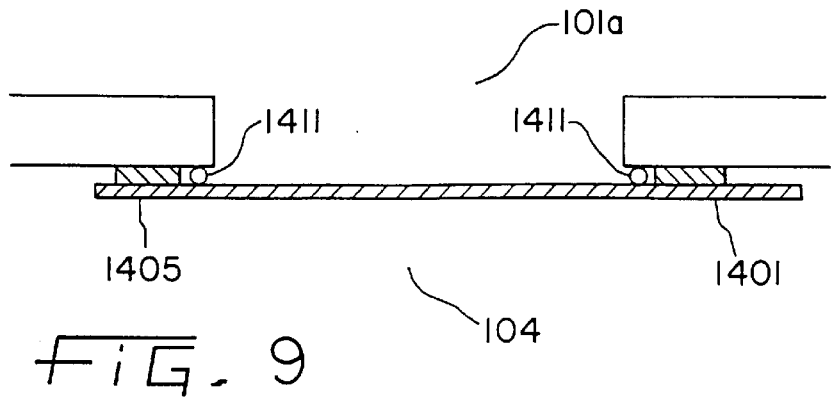

As the high speed gate valve, it is preferable to use the valve as given in FIGS. 9–12. FIG. 9 is a sectional view of a high speed gate valve used for the equipment of this invention, and it matches with the status where the gate between the process chamber 101*a* and the transport chamber 104 is closed. 1401 is a Ti thin plate with thickness of 0.2–0.5 mm. To open or close this, a mechanism as shown in FIG. 10 may be used. FIG. 10 is a drawing of the gate valve of FIG. 9 as it is seen from below, and Ti thin plate 1401 is supported by two arms 1402 and 1402' at two points 1403 and 1403'. 1404 and 1404' are the pins to attach the arms on the chamber, and the arms are moved with these pins as supporting points. In other words, by moving the arm 1402, 1401 is moved. Here, it is important that 1401 is a thin plate (e.g. Ti thin plate), and it has a very low weight. Accordingly, it can be moved at high speed by a simple mechanism as shown in FIG. 10. To reduce the weight of 1401, the thickness of Ti may be decreased to less than 0.1 mm and it may be reinforced by attaching it on a plastic plate. Or the surface of reinforced plastics may be coated with a metal material such as Ti, Mo, W, etc. to obtain a lightweight and durable plate. Even when such a thin plate is used, the pressure in both chambers separated by thin plate 1401 is several Torr at the most, and there arises no problem with strength.

The material for the thin plate is not limited to Ti, and duralmin or other materials may be used. Also, it is preferable that the surface of thin plate 1401 or the sealing portion 1405 has R$_{max}$ of less than 0.1 μm.

Figure 11:
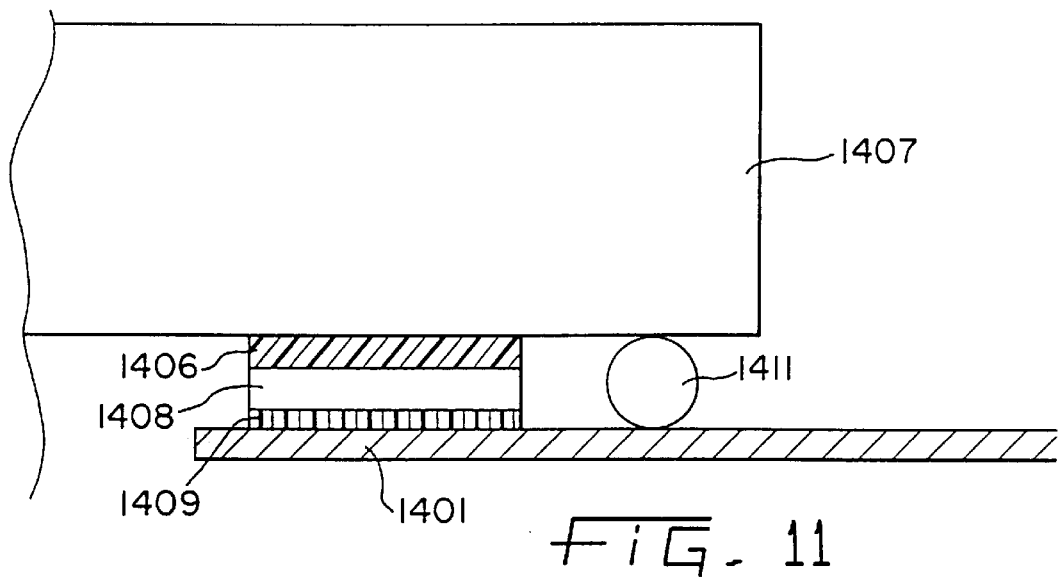

In FIG. 9, 1405 represents a vacuum sealing portion, and its enlarged view is given in FIG. 11. In this figure, 1406 is made of insulating material and is fixed on the wall of the chamber 1407. 1408 is a metal electrode and is connected with one of the electrodes of the DC power supply (not shown). The other electrode of this DC power supply is connected with the gate valve 1401. 1409 is an insulating material having thickness of 10 to several hundreds of μm. When voltage of several hundred volt is applied between electrodes 1408 and 1401, gate valve is pulled by electrostatic force, and vacuum sealing is achieved by this force. Accordingly, a material with elasticity should be used as 1409. Mechanical strength and suction force are actualized by the arrangement as described above. An airtight sealing material 1411 is provided. However, it may not be necessarily provided because sufficient airtightness can be furnished even when the sealing material is not provided. It is preferable not to provide it from the viewpoint to prevent gas release from the sealing material.

The high speed gate valve of FIGS. 9–12 is distinguished from the conventional example by the new features that high speed opening and closing operations can be achieved by lightweight gate valve 1401 and that the electrostatic chuck principle is adopted for vacuum sealing and mechanical force is not used. This has made it possible to extensively shorten the time required for opening and closing to 0.2 to 0.5 seconds compared with several to several tens of seconds in the case of a conventional type gate valve.

Figure 12:
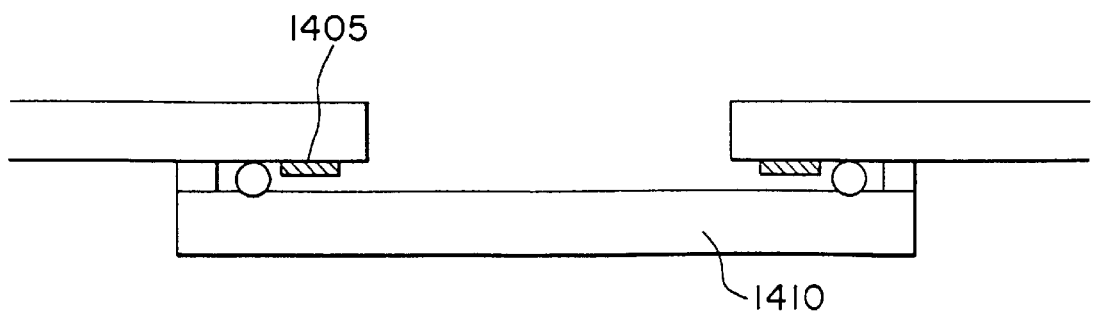

The gate valve as used here can be used only in case the chambers at both ends of the gate valve are under a vacuum condition of several Torr or less. It is not usable because of its strength in case one of the chambers returns to atmospheric pressure. In such case, lightweight gate valve 1401 may be opened as shown in FIG. 12, and the gate valve 1410 to seal by conventional mechanical force may be closed. The gate valves of 106*a*–106*d* in FIG. 1 are used only in case the chambers at both ends are under a high vacuum condition. The gate valve such as 1410 is used only when the chamber is returned to atmospheric pressure for maintenance, for example, and high speed gate valve can be used at all times during the process. Also, for the gate valves 105*e* and 105*f*, high speed gate valve may be used at all times for the insertion and the removal of wafer between load chamber or unload chamber (102, 103) and the transport chamber 104. However, when the wafer is placed into or removed from the equipment, it is necessary to return 102 and 103 to atmospheric pressure, and conventional type gate valve 1410 may be used although opening and closing speed is slow. This operation is necessary only when the wafer is mounted or removed from the equipment in batch, and this does not result in longer wafer processing time.

Also, description has been given on the case where 4 chambers are combined together, while such combination may be changed when necessary or the chambers may be increased or decreased.

Other Embodiments

In the embodiments as described above, the wafers are placed into and removed from each reduced pressure chamber by moving the wafer susceptor (to the vertical direction in the case of FIG. 1). Here, description will be given in the case where the wafer susceptor remains in a stationary condition.

In this embodiment, a moving arm having gripping means to grip the wafer at its tip is provided at the position face-to-face to the gate valves 105a to 105c of each of the reduced pressure chambers 101a to 101c. The moving arm traverses the transport chamber 104 and moves back and forth toward the reduced pressure chambers 101a to 101c. This moving arm can receive and deliver the wafer by the gripping means at the tip.

Next, description will be given on an example of the procedure to transport wafers in this embodiment.

First, the wafer 106e to be processed is placed on the wafer holder 107e in the load chamber 102. This wafer 106e is held by the gripping means at the tip of the moving arm 130e, and the moving arm is moved forward into the transport chamber 104. Gate valve 105e is opened, and the moving arm 130e is moved forward. The wafer 106e is delivered to the transport vehicle 512 waiting in the transport chamber 104. After delivery, the moving arm 130e moves back and the gate valve 105e is closed. On the other hand, upon receipt of the wafer 106e, the transport vehicle 512 moves to the front of cleaning chamber 101c on the track 511. It stops in front of the cleaning chamber 101b, and gate valve 105c is opened. Moving arm 130c moves forward and grips the wafer on the transport vehicle. With the wafer gripped, the moving arm 130e moves further forward and delivers the wafer to the wafer holder 107c in the cleaning chamber 101c. After delivery, the moving arm moves back, and the gate valve 105c is closed. The transport of wafers between the reduced pressure chambers may be performed in the same way. Thus, the wafer can be transported without breaking the vacuum condition.

Although not shown in the drawings, an exhaust system is connected to the transport chamber 104, reduced pressure chambers 101a to 101c, load chamber 102, and unload chamber 103.

By this invention, it is possible to obtain various types of thin film laminated structures with high reliability and characteristics to be used for ultra-high density integrated circuits. As the result, integrated circuits with higher degree of integration and with high reliability can be produced.

What we claim is:

1. A thin film forming apparatus, comprising:

a first electrode to which a substrate can be attached;

a second electrode to which a target can be attached, said first and said second electrodes facing one another;

a high-frequency power supply attached to said second electrode; and a resonating circuit connected to said first electrode and said second electrode, said resonating circuit resonating only to an output frequency from said high frequency power supply;

said resonating circuit comprising circuit components which are arranged symmetrically with respect to one another.

2. A thin film forming apparatus, comprising:

a first electrode to which a substrate can be attached;

a second electrode to which a target can be attached, said first and said second electrodes facing one another;

a first high-frequency power supply attached to said first electrode and a second high-frequency power supply attached to said second electrode;

a first resonating circuit connected to said first and said second electrodes, said first resonating circuit resonating only to a second output frequency generated by said second high-frequency power supply;

a second resonating circuit connected to said first and said second electrodes, said second resonating circuit resonating only to a first output frequency generated by said first high-frequency power supply; and said first resonating circuit comprising first circuit components, said first circuit components being arranged symmetrically with respect to one another, said second resonating circuit comprising second circuit components, said second circuit components being arranged symmetrically with respect to one another.

* * * * *